United States Patent
Takahashi et al.

(10) Patent No.: US 7,816,955 B2
(45) Date of Patent: Oct. 19, 2010

(54) RAMP GENERATOR AND CIRCUIT PATTERN INSPECTION APPARATUS USING THE SAME RAMP GENERATOR

(75) Inventors: Masayoshi Takahashi, Yokohama (JP); Kengo Imagawa, Fujisawa (JP); Norio Chujo, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 119 days.

(21) Appl. No.: 12/044,108

(22) Filed: Mar. 7, 2008

(65) Prior Publication Data

US 2008/0231330 A1 Sep. 25, 2008

(30) Foreign Application Priority Data

Mar. 20, 2007 (JP) .............................. 2007-072800

(51) Int. Cl.
H03K 4/06 (2006.01)
(52) U.S. Cl. ....................................... 327/131; 327/134
(58) Field of Classification Search ......... 327/131–134, 327/136, 137, 140
See application file for complete search history.

(56) References Cited

U.S. PATENT DOCUMENTS

| | | | | |
|---|---|---|---|---|
| 4,009,399 A | * | 2/1977 | Hofer | 327/132 |
| 4,728,813 A | * | 3/1988 | Diller | 327/132 |
| 4,855,651 A | * | 8/1989 | Jobling et al. | 315/387 |
| 4,952,834 A | * | 8/1990 | Okada | 310/316.02 |
| 4,967,139 A | * | 10/1990 | Betti et al. | 323/312 |
| 5,021,784 A | * | 6/1991 | Groeneveld et al. | 341/120 |
| 5,120,984 A | * | 6/1992 | Klatser | 327/132 |
| 5,311,115 A | * | 5/1994 | Archer | 323/315 |
| 5,333,495 A | * | 8/1994 | Yamaguchi et al. | 73/105 |
| 5,418,501 A | * | 5/1995 | Schoofs et al. | 331/111 |
| 5,945,792 A | * | 8/1999 | Koblitz | 315/408 |
| 6,031,217 A | * | 2/2000 | Aswell et al. | 250/208.1 |
| 6,160,435 A | * | 12/2000 | Kim | 327/336 |
| 6,294,945 B1 | * | 9/2001 | Regier et al. | 327/341 |

(Continued)

FOREIGN PATENT DOCUMENTS

| | | |
|---|---|---|
| JP | 3256405 | 11/1991 |
| JP | 4048812 | 2/1992 |
| JP | 06-014209 | 1/1994 |
| JP | 3042956 | 8/1997 |
| JP | 10112810 | 4/1998 |

OTHER PUBLICATIONS

Japanese Office Action in JP 2007-072800 (in Japanese), dated Jun. 23, 2009.

*Primary Examiner*—Lincoln Donovan
*Assistant Examiner*—Thomas J Hiltunen
(74) *Attorney, Agent, or Firm*—Antonelli, Terry, Stout & Kraus, LLP.

(57) ABSTRACT

The present invention provides a ramp generator capable of appropriately setting a rise starting point of an output voltage of a ramp waveform and an output voltage at the time of stable output. A current adjustment unit including a differential pair of transistors and an amplifier constitute a feedback circuit. By controlling the charging/discharging of an integration capacitor by ON/OFF of a discharge current source connected to a common emitter terminal of the current adjustment unit, an output of the ramp waveform outputted from an output terminal disposed at the connection end of the integration capacitor is controlled.

5 Claims, 12 Drawing Sheets

U.S. PATENT DOCUMENTS

| | | | |
|---|---|---|---|
| 6,304,128 B1 * | 10/2001 | Shulman | 327/345 |
| 6,366,125 B1 * | 4/2002 | Rochard | 326/82 |
| 6,462,527 B1 * | 10/2002 | Maneatis | 323/315 |
| 6,549,081 B1 * | 4/2003 | Le et al. | 331/57 |
| 6,653,886 B1 * | 11/2003 | Lee et al. | 327/374 |
| 7,064,694 B1 * | 6/2006 | Male et al. | 341/129 |
| 2004/0140843 A1 * | 7/2004 | Rodby | 327/336 |
| 2009/0277696 A1 * | 11/2009 | Reynolds et al. | 178/18.06 |

* cited by examiner

US 7,816,955 B2

RAMP GENERATOR AND CIRCUIT PATTERN INSPECTION APPARATUS USING THE SAME RAMP GENERATOR

CROSS-REFERENCE TO RELATED APPLICATION

The present application claims priority from Japanese Patent Application No. JP 2007-072800 filed on Mar. 20, 2007, the content of which is hereby incorporated by reference into this application.

TECHNICAL FIELD OF THE INVENTION

The present invention relates to a ramp generator used for the control to change an electron beam and the like. In particular, the present invention relates to a current-integration ramp generator.

BACKGROUND OF THE INVENTION

As a conventional technology, Japanese Patent Application Laid-Open Publication No. 6-14209 (Patent Document 1) discloses a circuit for generating a ramp waveform by switching the charge/discharge current flowing in an integration capacitor. FIG. 12 shows a conventional circuit example described in Patent Document 1. In this figure, the terminal voltage of an integration capacitor 101 is applied to two voltage comparison circuits 102 and 103 having threshold voltages VL104 and VH105, a flip-flop 106 is set and reset by the outputs of the voltage comparison circuits, and a switching signal is outputted by a current switching circuit 107. The current switching circuit 107 is configured of a current mirror unit including a diode D11 and a transistor Q11, a constant current source I11, and switching transistors Q12 and Q13. The charge current and the discharge current repeatedly flow to the integration capacitor 101 by the switching of the charge/discharge current, thereby generating a ramp waveform.

SUMMARY OF THE INVENTION

However, the ramp generator used conventionally has a problem that the offset control of deflection that is necessary in an apparatus is difficult because it is not possible to set the start voltage.

An object of the present invention is to provide a current-integration ramp generator capable of the start voltage control.

The above and other objects and novel characteristics of the present invention will be apparent from the description of this specification and the accompanying drawings.

The typical ones of the inventions disclosed in this application will be briefly described as follows.

A ramp generator according to the present invention comprises: a capacitor for charging/discharging current; a constant current source (charge current source) for charging the capacitor; a constant current source (discharge current source) for discharging the capacitor; a current adjustment unit connected to the capacitor and the charge current source; an amplifier configuring a feedback circuit together with the current adjustment unit; a switch; and a variable reference voltage source connected to the amplifier and defining a start voltage of a ramp waveform, wherein the current adjustment unit is connected to the discharge current source via the switch, the capacitor is charged/discharged by an operation of the switch, and the ramp waveform is outputted from a connection point of the capacitor and the charge current source.

Also, in the ramp generator according to the present invention, the current adjustment unit includes a differential pair of two transistors, the amplifier is connected to a base terminal of one transistor connected to the charge current source, and a reference voltage generation unit is connected to a base terminal of the other transistor.

Also, another aspect of a ramp generator according to the present invention comprises: a current integrator for charging/discharging current; a constant current source (charge current source) for charging the current integrator; a constant current source (discharge current source) for discharging the current integrator; a current adjustment unit connected to the current integrator and the charge current source; a differential amplifier configuring a feedback circuit together with the current adjustment unit; a switch; and a variable reference voltage source connected to the differential amplifier and defining a start voltage of a ramp waveform, wherein the current adjustment unit is connected to the discharge current source via the switch, the current integrator is charged/discharged by an operation of the switch, and the ramp waveform is outputted from a connection point of the current integrator and the differential amplifier.

In this ramp generator, the current adjustment unit includes a differential pair of two transistors, a reference voltage generation unit is connected to a base terminal of one transistor connected to the charge current source, and the differential amplifier is connected to a base terminal of the other transistor.

This ramp generator further comprises: a second switch and a second discharge current source, wherein the second discharge current source is connected in parallel with the switch and the discharge current source.

Another aspect of a ramp generator according to the present invention comprises: a capacitor for charging/discharging current; a constant current source (charge current source) for charging the capacitor; a constant current source (discharge current source) for discharging the capacitor; a first feedback circuit; a first selector; a second feedback circuit; and a second selector, wherein the first feedback circuit is connected to the first selector and the capacitor, the second feedback circuit is connected to the second selector and the capacitor, the first selector selects whether the discharge current source is connected to the capacitor via the first feedback circuit, the discharge current source is directly connected to the capacitor, or the discharge current source is opened, the second selector selects whether the charge current source is connected to the capacitor via the first feedback circuit, the charge current source is directly connected to the capacitor, or the charge current source is opened, charging of the capacitor starts when the first selector opens the discharge current source, discharging of the capacitor starts when the second selector opens the charge current source, and a ramp waveform is outputted from a connection point of the capacitor, the first feedback circuit, the second feedback circuit, the first selector and the second selector.

This ramp generator further comprises: an auxiliary charge current source; an auxiliary discharge current source; a first switch; and a second switch, wherein the auxiliary discharge current source is connected to the first selector in parallel to the discharge current source via the first switch, and the auxiliary charge current source is connected to the second selector in parallel to the charge current source via the second switch. Also, operating conditions of the first feedback circuit and the second feedback circuit are satisfied by switching the first switch and the second switch. Further, the first feedback circuit includes: a current adjustment circuit including a differential pair of two transistors; an amplifier; and a variable reference voltage source, the second feedback circuit includes: a current adjustment circuit including a differential pair of two transistors; an amplifier; and a variable reference voltage source, the variable reference voltage source of the first feedback circuit sets a stable voltage on a low voltage side, and the variable reference voltage source of the second feedback circuit sets a stable voltage on a high voltage side.

It is also possible to apply these ramp generators to a circuit pattern inspection apparatus.

The effects obtained by typical aspects of the present invention will be briefly described below.

That is, by making it possible to appropriately control the start of generation of the ramp waveform and arbitrarily set the start voltage in a design phase in a current-integration ramp generator, the offset control of deflection required in the apparatus to which the current-integration ramp generator is applied can be realized.

BRIEF DESCRIPTIONS OF THE DRAWINGS

DESCRIPTIONS OF THE PREFERRED EMBODIMENTS

Embodiments of the present invention will be described below with reference to the accompanying drawings.

First Embodiment

Figure 1:
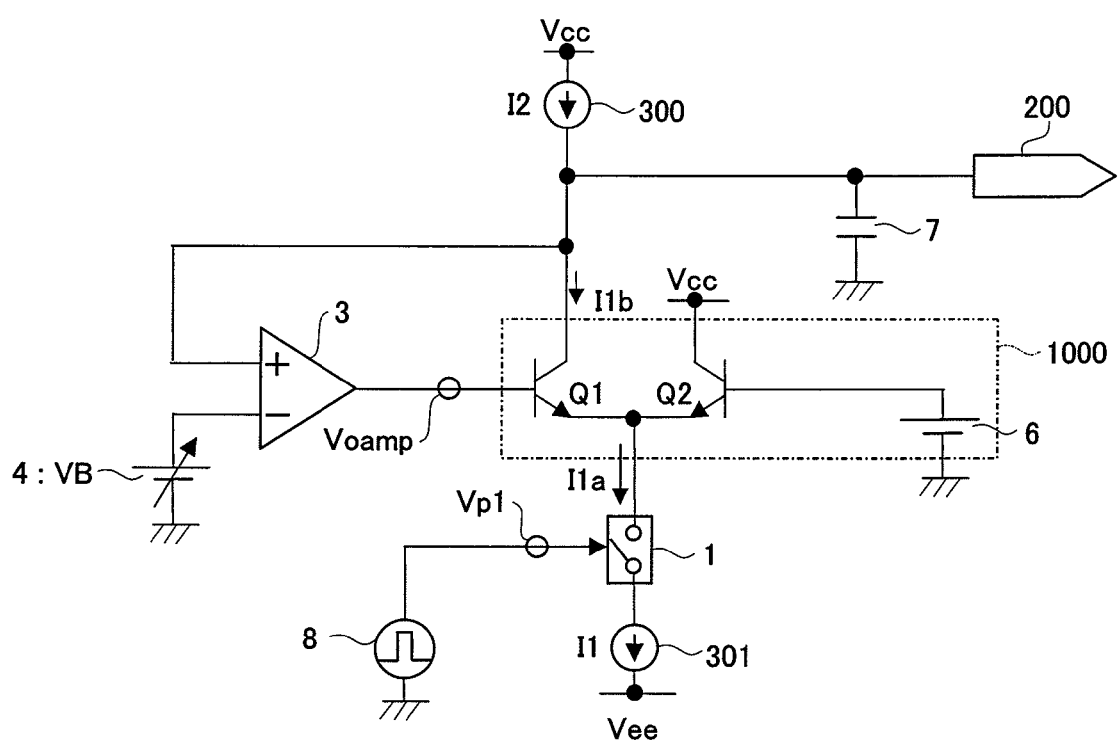
FIG. 1 is a circuit diagram of a ramp generator according to a first embodiment of the present invention.
Figure 2:
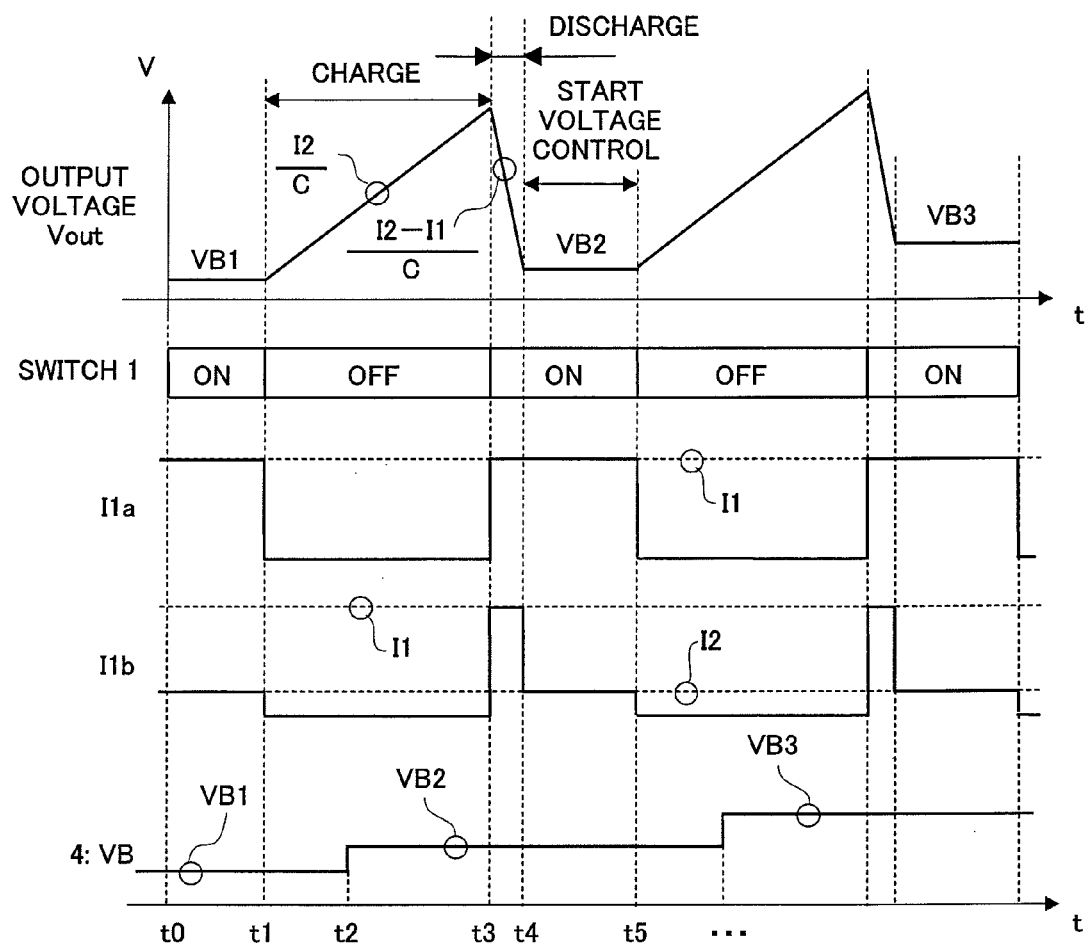
FIG. 2 is a waveform chart of the ramp generator according to the first embodiment of the present invention.

FIG. 1 is a circuit diagram showing a first embodiment of a ramp generator according to the present invention, and FIG. 2 is a waveform chart showing an operation waveform when the circuit is operated.

The ramp generator according to the present embodiment is configured of a switch 1, an amplifier 3, a variable reference voltage generation unit 4, a reference voltage generation unit 6, an integration capacitor 7, a timing signal generation unit 8, a transistor Q1, a transistor Q2, an output terminal 200, a constant current source (charge current source) 300, and a constant current source (discharge current source) 301. A current value of the charge current source 300 is defined as I2 and a current value of the discharge current source 301 is defined as I1.

The transistor Q1 and the transistor Q2 are both NPN transistors, and such two transistors constitute a differential pair. A collector terminal of the transistor Q1 is connected to Vcc via the charge current source 300. Also, a collector terminal of the transistor Q2 is directly connected to Vcc. Further, the reference voltage generation unit 6 is connected to a base terminal of the transistor Q2, so that the reference voltage generation unit 6 and the transistors Q1 and Q2 operate as a current adjustment unit 1000. A common emitter terminal of the two transistors of the current adjustment unit 1000 and the discharge current source 301 are connected via the switch 1.

Whether or not the discharge current of the discharge current source 301 flows to the current adjustment unit 1000 is switched by ON/OFF of the switch 1. ON/OFF of the switch 1 is controlled by an output signal Vp1 of the timing signal generation unit 8. Note that the following description will be made on the assumption that the switch 1 is turned ON when the output of the timing signal generation unit 8 is High.

The integration capacitor 7 has the capacity C. The integration capacitor 7 is grounded at a connection point of the charge current source 300 and the transistor Q1. The integration capacitor 7 is repeatedly charged/discharged by the current I2 of the charge current source 300 and the discharge current I1b which is the collector current of the transistor Q1. The voltage Vout indicating the ramp waveform is outputted from an output terminal 200 by repeating the charging/discharging.

The amplifier 3 amplifies the difference between the terminal voltage of the integration capacitor 7 and the output voltage VB of the variable reference voltage generation unit 4 and outputs the voltage Voamp to the base terminal of the transistor Q1.

The differential pair including the transistor Q1 and the transistor Q2 adjusts the discharge current I1b based on the voltage value Vref of the difference between the output voltage Voamp (base terminal voltage of the transistor Q1) of the amplifier 3 and the output voltage (base terminal voltage of the transistor Q2) of the reference voltage generation unit 6. The discharging amount of the integration capacitor 7 is controlled by this adjustment of the discharge current I1b.

The variable reference voltage generation unit 4 is a variable reference voltage source that enables the setting of the start voltage, which is the feature of the present invention. When the switch 1 is turned ON, the discharge current I1 of the discharge current source 301 flows to the differential pair including the transistor Q1 and the transistor Q2. At this time (when the switch 1 is turned ON), the amplifier 3 and the current adjustment unit 1000 constitute a feedback circuit and operate so that the voltage Vout of the output terminal 200 and the output voltage VB of the variable reference voltage generation unit 4 become equal.

Specifically, when Vout>VB, the Voamp rises and the discharge current I1b becomes larger, and the voltage Vout lowers and approaches VB. On the other hand, when Vout<VB, the Voamp lowers and the discharge current I1b also becomes smaller, and the voltage Vout rises and approaches VB1. The discharge current I1b is balanced by such an operation. Finally, when I2=I1b is obtained (when discharge from the integration capacitor 7 is stopped), the output voltage VB of the variable reference voltage generation unit 4 and the voltage Vout of the output terminal 200 become equal, and the voltage Vout becomes constant.

Note that I1>I2 has to be achieved when configuring such a circuit.

Next, the operation of the ramp waveform circuit according to the present invention will be described with reference to the waveform chart in FIG. 2. In this figure, the description will be started from when the voltage VB of the variable reference voltage generation unit 4 is set to VB1 in advance to turn ON the switch 1 and then the voltage of the output terminal 200 stabilizes at VB1.

As described above, when Vout becomes constant at VB1 at the starting point t0 of FIG. 2, Vout stabilizes in this state until the switch 1 is turned OFF. When the switch 1 is turned OFF at the timing of t1 by the output of the timing signal generation unit 8, the current I1a of the common emitter terminal of the differential pair including the transistor Q1 and the transistor Q2 and the discharge current I1b become zero. As a result, the current I2 of the charge current source 300 flows only to the integration capacitor 7 and the integration capacitor 7 is charged (charge up). The increase pace (slope of Vout from t1 to t3 in FIG. 2) of current at this time is dV/dt=I2/C.

When the Vout rises to a predetermined voltage and the integration capacitor 7 is to be discharged, the switch 1 is turned ON by the timing signal generation unit 8. This timing is t3 in this figure. Since the voltage Vout of the output terminal 200 at this time is higher than the voltage of the variable reference voltage generation unit 4 (Vout>VB), the integration capacitor 7 starts to discharge to obtain I1b=I1. The slope at this time is dV/dt=(I2−I1)/C, and the value of I1b takes a current value greater than or equal to the current I2 of the charge current source 300 (see current value I1b from t3 to t4 in FIG. 2).

Note that, by changing the value of the variable reference voltage generation unit 4 during the charge up period (t1 to t3 in FIG. 2) of the integration capacitor (timing of t2 in FIG. 2), the voltage level of the output terminal 200 to be a target of discharge after turning ON the switch 1 at t3 can be changed. In FIG. 2, the output voltage VB of the variable reference voltage generation unit 4 is raised to VB2 (VB2>VB1) at the timing of t2.

When the voltage Vout of the output terminal 200 reaches the target voltage level VB2 after the change (t4 in FIG. 2), the voltage Vout of the output terminal 200 becomes constant (t4 to t5 in FIG. 2).

Thereafter, the ramp waveform can be continuously outputted by repeating the operation in the same manner.

With the configuration described above, the current-integration ramp generator capable of freely controlling the start point of the ramp waveform by the switch 1 and capable of controlling the voltage value of the voltage Vout of the output terminal 200 in a stable state can be realized.

Although the current adjustment unit 1000 uses the transistor Q1 and the transistor Q2 in the above description, needless to say, other elements such as MOSFET can be used instead of the transistor Q1 and the transistor Q2.

Second Embodiment

Next, a second embodiment of the present invention will be described with reference to FIG. 3 and FIG. 4.

Figure 3:
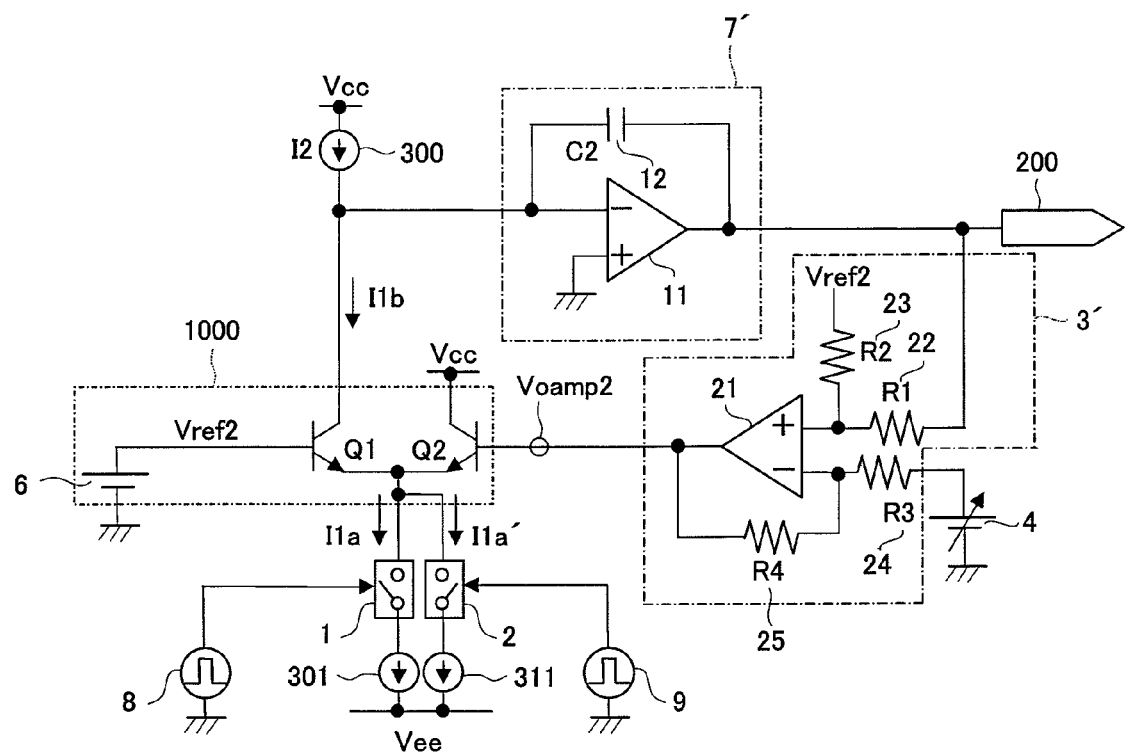
FIG. 3 is a circuit diagram of a ramp generator according to a second embodiment of the present invention.
Figure 4:
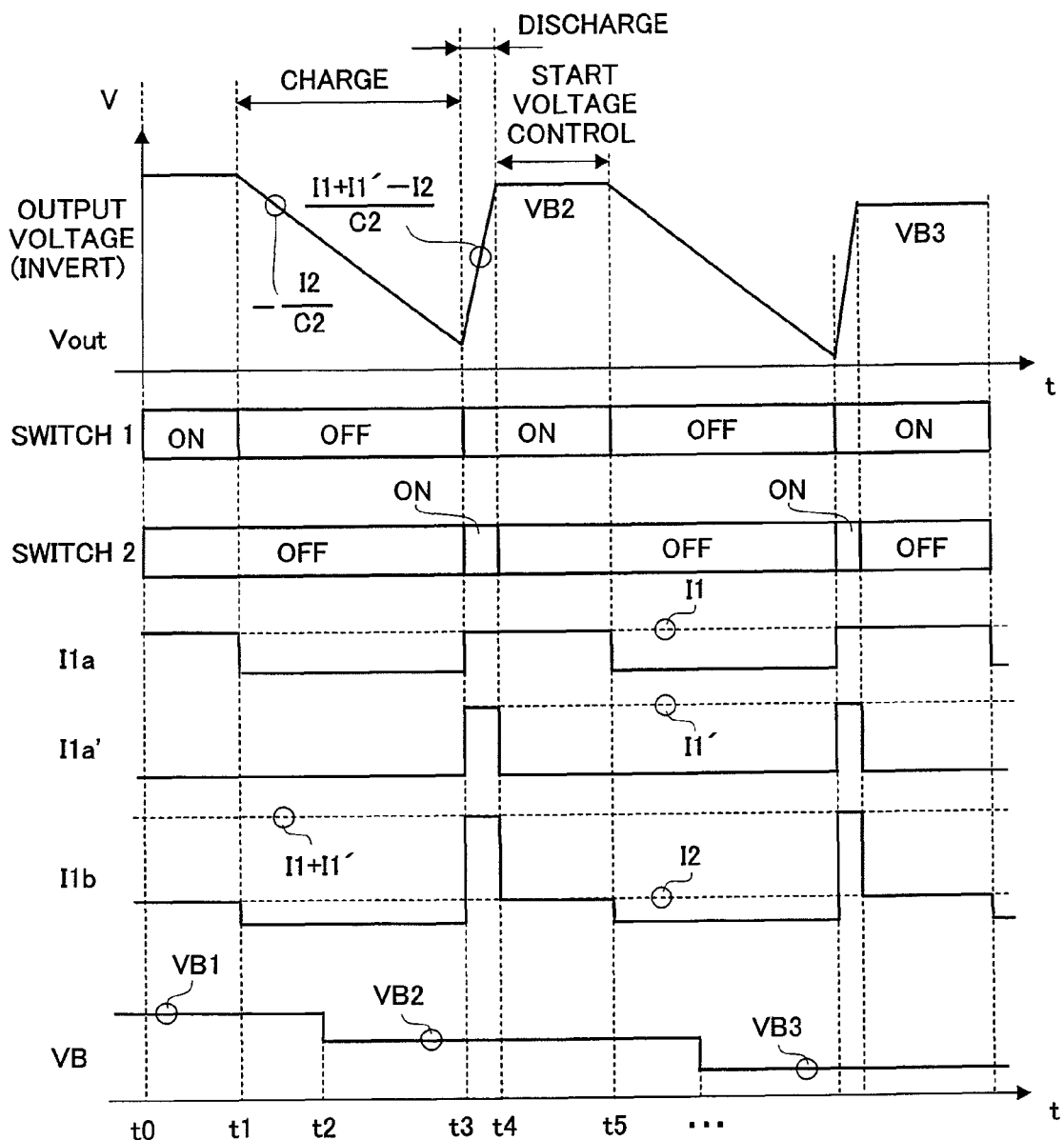
FIG. 4 is a waveform chart of the ramp generator according to the second embodiment of the present invention.

FIG. 3 is a circuit diagram of a ramp generator of the present embodiment, and FIG. 4 is a waveform chart showing the operation waveform when the circuit is operated. The circuit will first be described based on FIG. 3.

In the present embodiment, the switch 1, the variable reference voltage generation unit 4, the reference voltage generation unit 6, the timing signal generation unit 8, the transistor Q1, the transistor Q2, the output terminal 200, and the charge/discharge current source 300 have a configuration similar to that of the first embodiment.

On the other hand, in place of the integration capacitor 7 of the first embodiment, a current integrator 7' including an amplifier 11 and a capacitor 12 is disposed. The capacity of the capacitor 12 is defined as C2.

Further, in place of the amplifier 3, an amplifier circuit (differential amplifier) 3' including a voltage feedback amplifier 21 and resistors 22, 23, 24 and 25 serving as a peripheral circuit thereof is disposed.

Also, although only one set of the switch 1 and the timing signal generation unit 8 and the discharge current source 301 for operating the switch 1 is provided in the first embodiment, a switch 2, a second timing signal generation unit 9, and a constant current source (second discharge current source) 311 are further disposed in the present embodiment.

The current integrator 7' constitutes a mirror integration circuit including the amplifier 11 and the capacitor 12. Different from the integration capacitor 7, the polarity of the output of the current integrator 7' is inverted. Thus, different from the first embodiment, the output Vout of an inverting amplifier circuit is an output whose polarity is inverted as shown in FIG. 4. Accordingly, although the output of the amplifier 3 is connected to the base terminal of the transistor Q1 in FIG. 1, it is connected to the base terminal of the opposing transistor Q2 of the differential pair in this figure. Correspondingly, the reference voltage generation unit 6 is connected to the base terminal of the transistor Q1.

The amplifier circuit 3' and the current adjustment unit 1000 constitute the feedback circuit and operate so that the output voltage VB of the variable reference voltage generation unit 4 and the voltage Vout of the output terminal 200 have equal voltage values.

Suppose the values of the resistor 22, the resistor 23, the resistor 24, and the resistor 25 of the amplifier circuit 3' are R1, R2, R3, and R4, the operating condition needs to be R1=R3 and R2=R4 (operating condition of the differential amplifier using an operational amplifier). With the configuration described above, the offset voltage by the input bias current of the amplifier 21 can be lowered, and the setting accuracy of the start voltage can be enhanced.

In order to lower the offset voltage of the amplifier circuit 3' described above, it is desired that Voamp2 and the output voltage of the reference voltage generation unit 6 are made equal in a period when Vout is fixed to VB (Vout=VB) and the output voltage of the reference voltage generation unit 6 is applied to the resistor 23 (Vref2 in FIG. 3). This indicates that the collector currents of Q1 and Q2 are equal, and I1b=I2 leads to I1=2·I2.

Thus, when the gain of the voltage feedback amplifier 21 is sufficiently large, the voltage gain of the amplifier circuit 3' becomes R2·R3/((R1+R2)·R3). When Vout>VB, the feedback circuit including the amplifier circuit 3' and the current adjustment unit 1000 raises the output voltage Voamp2 of the amplifier circuit to reduce the I1b and lowers the Vout. On the other hand, when Vout<VB, the Voamp2 is lowered to increase the discharge current value I1b and the Vout is raised. When Vout and VB are equal, I1B=I2 is obtained and Vout is fixed at VB. As a result, the offset voltage by the input bias current of the voltage feedback amplifier 21 is lowered, and the setting accuracy of the start voltage can be enhanced.

Also, since the input bias current of the voltage feedback amplifier 21 does not directly flow to the current integrator 7', the integration accuracy can be enhanced. Furthermore, since the potential of the collector terminal of Q1 is virtually grounded, the voltage dependency of the charge/discharge current is reduced, and as a result, satisfactory linearity can be advantageously obtained in comparison to the circuit of FIG. 1.

In the present embodiment, the discharge current source 301 and the second discharge current source 311 are provided as the constant current source for discharge. The following description will be made on the assumption that current of the discharge current source 301 is I1 similar to the first embodiment and the current of the second discharge current source 311 is I1'.

The purpose of providing the two constant current sources for discharge is that the slope of the output voltage of the output terminal 200 at the time of discharge is made steep by using one of the constant current sources to define the start voltage and the other constant current source only for the discharge.

In other words, the discharge current source 301 is used to define the start point voltage. Meanwhile, by the second discharge current source 311, $dV/dt=(I2-I1)/C2$ which is the slope at the time of discharge described in the first embodiment can be changed to $dV/dt=(I2-(I1+I1'))/C2$, so that the more rapid return to the start point voltage can be achieved in comparison to the first embodiment (polarity inversion of the current integrator 7' is not considered here because focus is placed only on the comparison with FIG. 2). Further, similar to the first embodiment, the operating condition of (I1+I1')>I2 (I1>I2 depending on the state of the switch 2) is necessary also in the present embodiment. Furthermore, I1'>0.

The configuration related to the switch 2, the second timing signal generation unit 9, and the second discharge current source 311 for achieving the steep slope (dV/dt) at the time of discharge can be applied also to the first embodiment.

The specific operation of the circuit will be described with reference to FIG. 4. Also in this figure, the description will be made on the assumption that the time when the voltage VB of the variable reference voltage generation unit 4 is set to VB1 in advance to turn ON the switch 1 and the voltage of the output terminal 200 stabilizes at VB1 is defined as t0. Also, the switch 2 is turned OFF at t0. This is because, since the discharge current source 301 is used to define the start voltage and the second discharge current source 311 is used to achieve the steep slope of the output voltage of the output terminal 200 at the time of output voltage discharge as described above, the switch 2 is turned OFF when the output is stable.

When the generation of the ramp waveform is required, the timing signal generation unit 8 turns OFF the switch 1 (t1 in FIG. 4). By this means, the current does not flow to the current adjustment unit 1000. As a result, the current I2 of the charge current source 300 flows only to the current integrator 7', and the capacitor 12 is charged up. At this time, the output voltage Vout of the output terminal 200 decreases with a slope of $(-I2/C2)$.

The capacitor 12 discharges when the capacitor 12 is charged up for a constant amount and further generation of the ramp waveform is not required (t3 in FIG. 4). At this time, the timing signal generation unit 8 turns ON the switch 1 and the second timing signal generation unit 9 turns ON the switch 2, respectively. Since Vout<VB at this time, $I1b=I1+I1'$ is obtained and the output voltage rises with a slope of $dV/dt=((I1+I1'-I2)/C2)$.

Note that, when the value of the start voltage VB which is the output of the variable reference voltage generation unit 4 is to be changed, the change is made during the charging of the capacitor 12 of the current integrator 7', similar to the first embodiment (t2 in FIG. 4). In this figure, the value of VB is changed from VB1 to VB2 at the timing of t2.

When the discharge is completed and $I1b=I2$ is reached, the second timing signal generation unit 9 turns OFF the switch 2 (t4 in FIG. 4). By this means, the Vout stabilizes at the start voltage VB2 set at t2 (t4 to t5 in FIG. 4).

As described above, the discharge current is divided to I1 and I1' and only I1 is supplied when the start voltage is fixed and I1+I1' is supplied during the discharge operation, so that the slope at the time of discharge can be increased and the start voltage can be set with high accuracy.

Although the current adjustment unit 1000 uses the transistor Q1 and the transistor Q2 in the above description, similar to the first embodiment, other elements such as MOSFET can be used instead of the transistor Q1 and the transistor Q2.

Further, the ramp waveforms having different slopes can be generated by the combination of I1a and I1a'.

Third Embodiment

Next, a third embodiment of the present invention will be described with reference to FIG. 5, FIG. 6, and FIG. 7.

In the second embodiment, the timing control at the discharge needs to be accurately performed. This problem will be described in FIG. 5.

Figure 5:
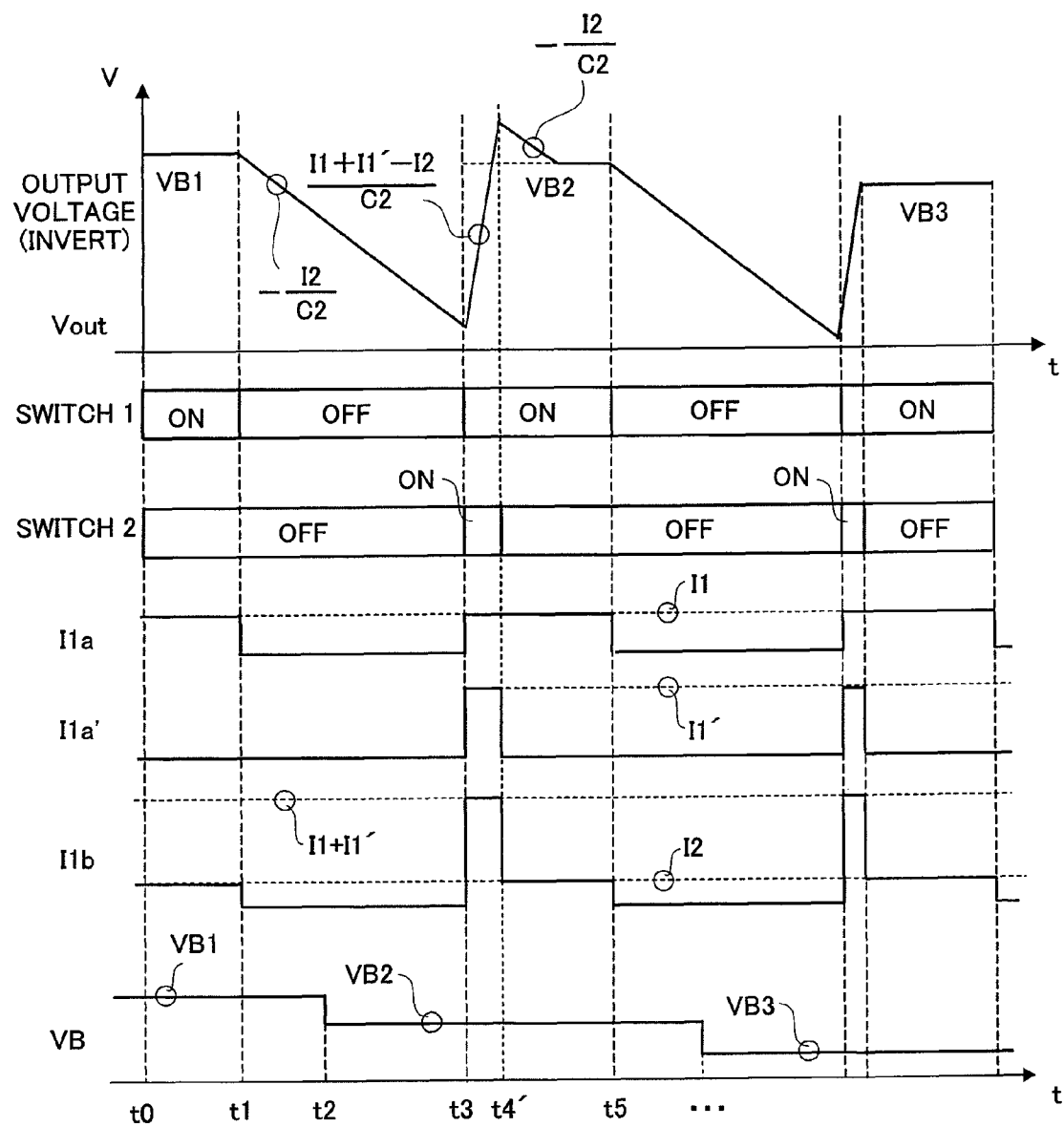
FIG. 5 is a waveform chart used in the description of a third embodiment of the present invention.

The timing (timing to open the switch 2) of t4' in FIG. 5 and the timing of t4 in FIG. 3 will be focused.

That is, when there is the response delay time td of the current adjustment unit 1000 from the output of the current integrator 7' and the opening of the switch 2 is delayed at the discharge, the voltage Vout of the output terminal 200 continuously rises until td with $dV/dt=((I1+I1'-I2)/C2)$. Then, when the time at which the current adjustment unit 1000 responds is reached (t4' in FIG. 5), the output voltage Vout starts to decrease with $dV/dt=-(I2/C2)$ and finally converges to Vout=VB2.

However, if the convergence to the start voltage delays due to the difference in timing, "stability of output of start voltage" of the original object cannot be achieved eventually. In particular, since there is the response delay in the feedback, the time required to converge to the start point becomes long in a state where dV/dt is large (in a state where current is large).

Figure 6:
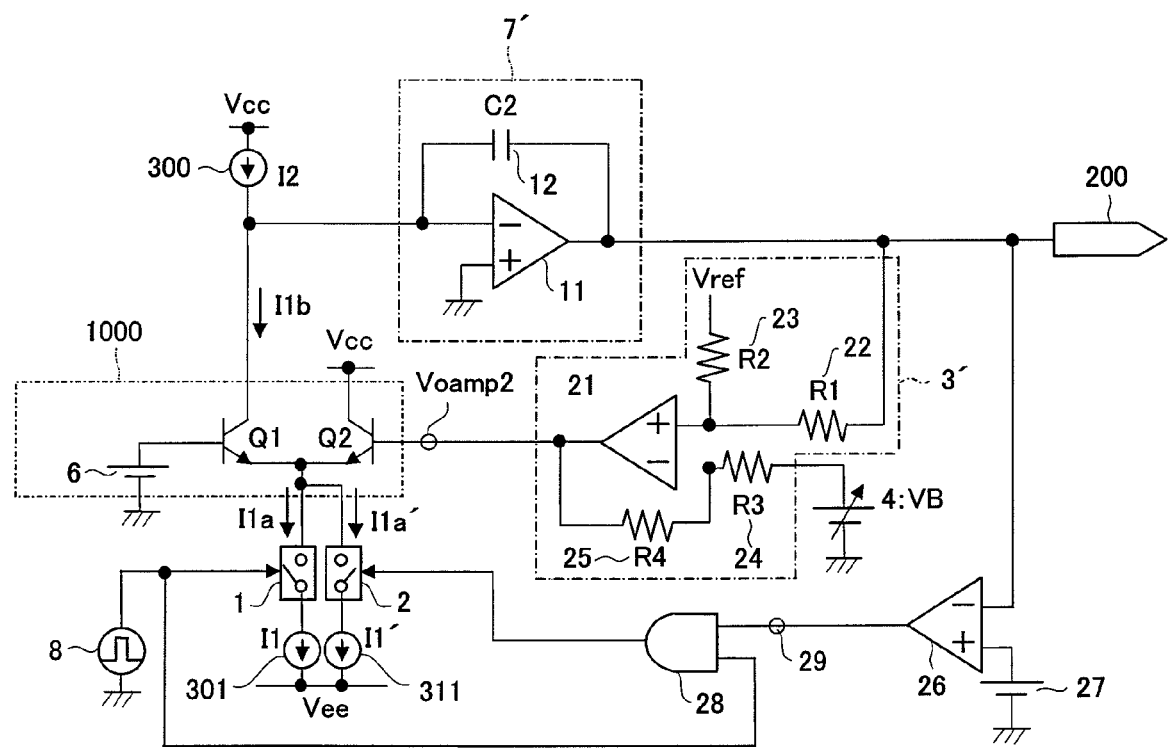
FIG. 6 is a circuit diagram of a ramp generator according to a third embodiment of the present invention.
Figure 7:
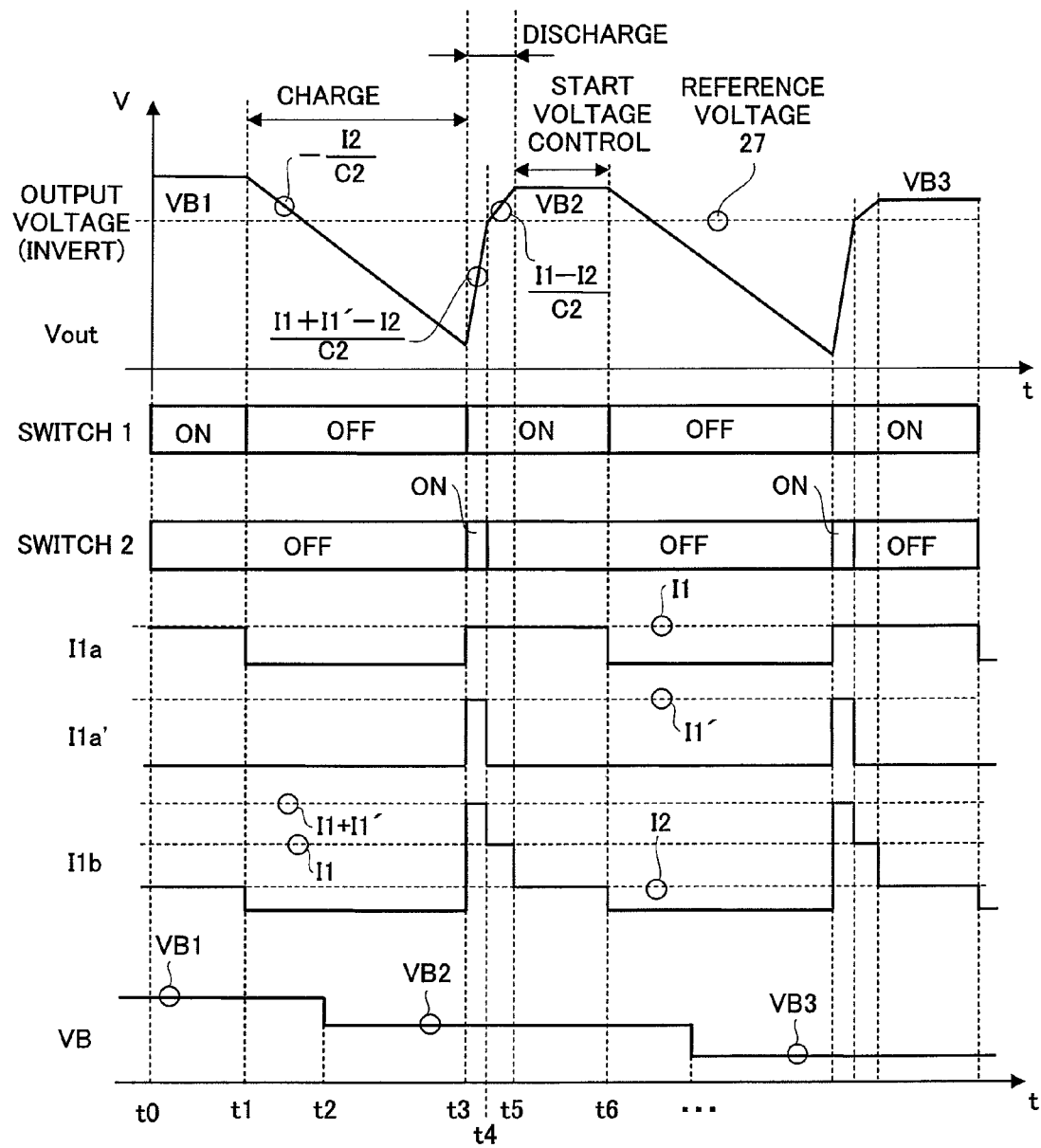
FIG. 7 is a waveform chart of the ramp generator according to the third embodiment of the present invention.

FIG. 6 is a circuit diagram of a ramp generator according to the present embodiment focused on the above-mentioned problem, and FIG. 7 is a waveform chart showing the operation waveform when the circuit is operated.

First, the circuit will first be described based on FIG. 6. The description of the circuit elements in common with the second embodiment will be omitted.

In the second embodiment, the rapid transition to the start voltage at the discharge can be realized. However, an active and accurate control for ON/OFF of the switch 2 by the second timing generation unit 9 is required.

In the third embodiment of the present invention, a comparator 26, a switch reference voltage generation circuit 27 and an AND circuit 28 are used in place of the timing signal generation unit 8, so that the necessity of an active operation is eliminated.

The output of the comparator 26 switches from High to Low when the voltage Vout of the output terminal 200 becomes larger than the voltage of the switch reference voltage generation circuit 27. The AND circuit 28 operates so as to turn ON the switch 2 when the output of the timing signal generation unit 8 is High and the output of the comparator 26 is also High.

Accordingly, by setting the voltage of the switch reference voltage generation circuit 27 to a voltage slightly lower than the output voltage VB of the variable reference voltage generation unit 4, the operation substantially similar to the timing signal generation unit 8 in FIG. 3 can be obtained without requiring the active operation.

Next, the operation of the circuit in this embodiment will be described with reference to the waveform chart of FIG. 7. Note that the operation in FIG. 7 is the same as that in FIG. 4 in the period until t3 which is the charge period of the capacitor 12 of the current integrator 7'. Therefore, the description up to this timing will be omitted.

When further generation of the ramp waveform is not necessary and the transition to the discharge of the capacitor 12 is to be made (t3 in FIG. 7), the switch 1 is turned ON by the timing generation circuit 8. At this timing, the voltage Vout of the output terminal 200 is lower than the voltage of the switch reference voltage generation circuit 27, and thus the output of the comparator 26 is High. Therefore, since both the output of the comparator 26 and the output of the timing signal generation unit 8 become High, the switch 2 is turned ON. By this means, I1b=I1+I1' is obtained, and the voltage Vout of the output terminal 200 rapidly rises with a slope of dV/dt=((I1+I1'-I2)/C2).

When the voltage Vout of the output terminal 200 continues to rise, it ultimately exceeds the voltage of the switch reference voltage generation circuit 27 that is the target of comparison in the comparator 26. If the voltage Vout exceeds the voltage of the switch reference voltage generation circuit 27, the output of the comparator 26 changes from High to Low. Therefore, the output of the AND circuit 28 also becomes Low. Accordingly, the switch 2 is turned OFF, and the value of I1b (discharge current value) becomes I1b=I1. As a result, the slope of the rise of the voltage Vout of the output terminal 200 becomes less steep (t4 in FIG. 7).

Thereafter, when I1b=I2 is reached, the value of the voltage Vout of the output terminal 200 becomes the start voltage VB2 set at t2. Subsequently, the value of the voltage Vout of the output terminal 200 stabilizes, and the ramp waveform output operation terminates (t5 in FIG. 7).

As described above, by the use of the comparator 26, the operation of the second embodiment can be performed without an active control other than the operation of the switch 1.

Note that, since the output voltage of the variable reference voltage generation unit 4 is "variable", the switch reference voltage generation circuit 27 may also be varied so as to be always slightly lower than the output voltage of the variable reference voltage generation unit 4 in conjunction with the output of the variable reference voltage generation unit 4. Further, the switch reference voltage generation circuit 27 may also be set to a voltage slightly lower than the minimum value of the output voltage of an assumed operation range of the variable reference voltage generation unit 4.

Fourth Embodiment

The first embodiment to the third embodiment are aimed to realize the control of the start point voltage and the control of the charge start time. On the other hand, with regard to the top end point in the voltage rise (bottom end point in the second and third embodiments), the stable operation is not ensured other than the upper limit of the capacity of the integration capacitor 7. Contrary to this, the fourth embodiment is aimed to enable the setting of the voltage value not only at the start point but also at the top end point (bottom end point). This will be described below with reference to the figures.

Figure 8:
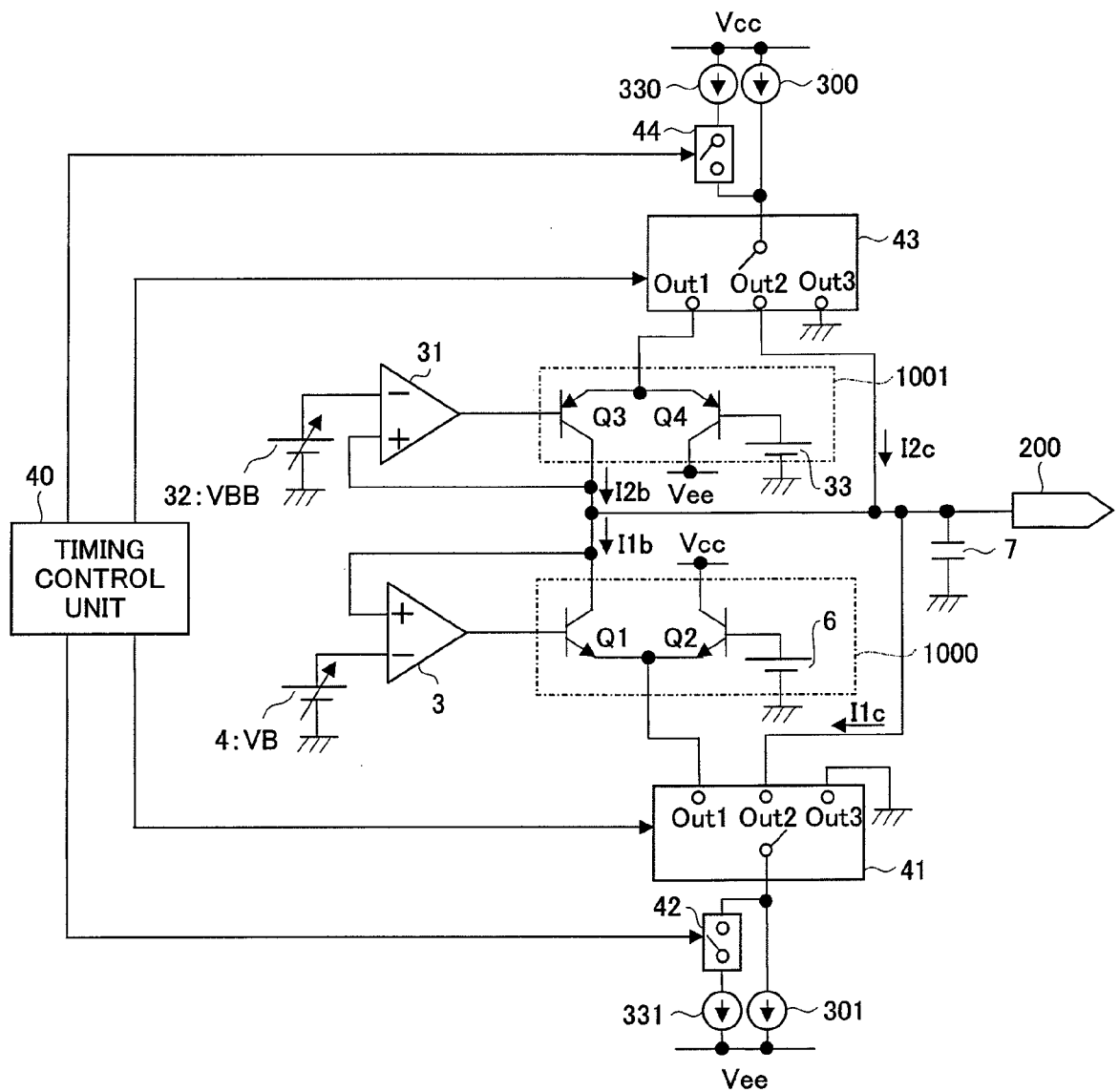
FIG. 8 is a circuit diagram of a ramp generator according to a fourth embodiment of the present invention.
Figure 9:
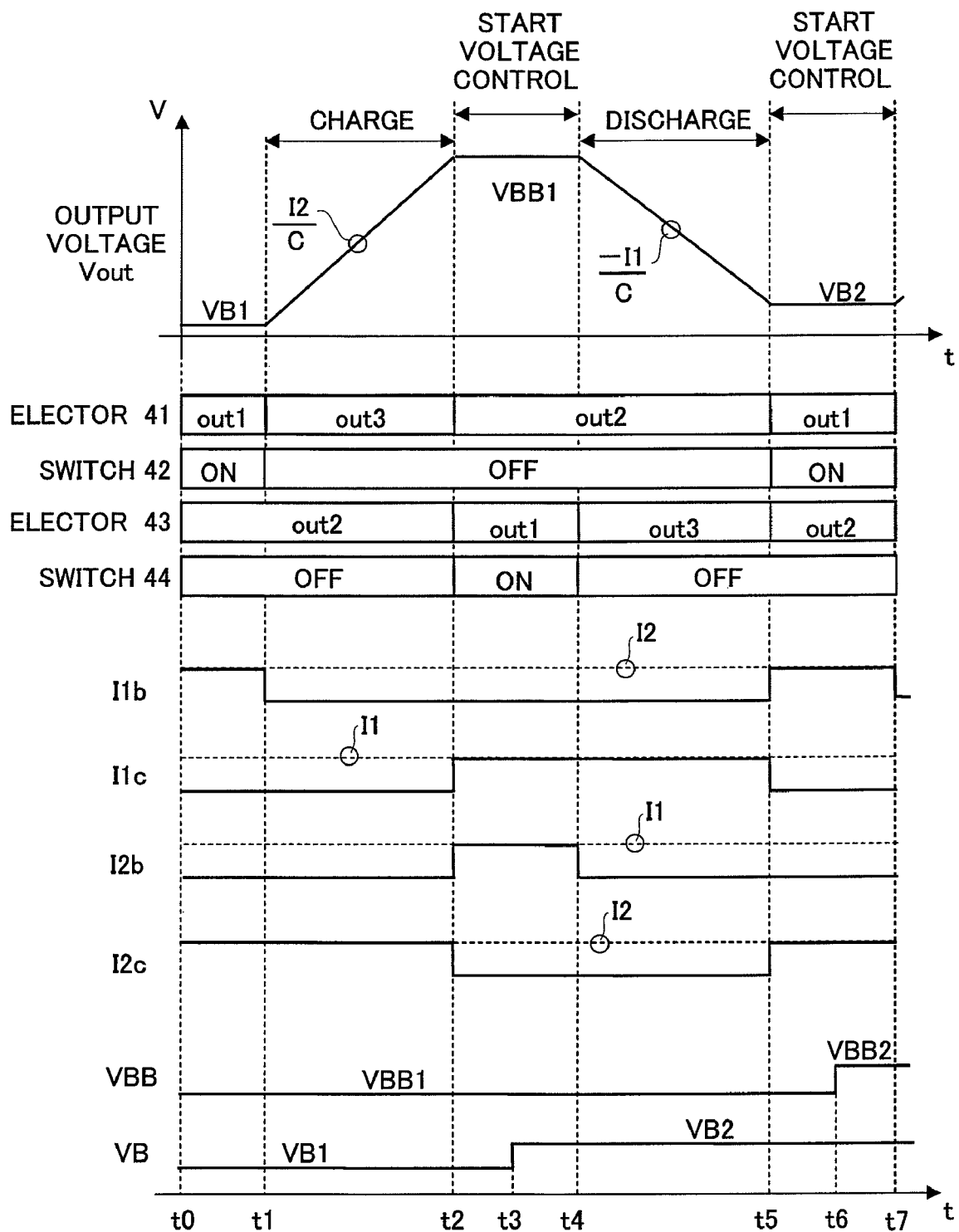
FIG. 9 is a waveform chart of the ramp generator according to the fourth embodiment of the present invention.

FIG. 8 is a circuit diagram of a ramp generator of the fourth embodiment. FIG. 9 is a waveform chart showing the operation waveform when the circuit is operated. The circuit of the present embodiment is obtained by modifying the circuit of the first embodiment. The circuit will first be described based on FIG. 8.

In the first embodiment to the third embodiment, the differential pair of transistors (current adjustment unit 1000) is provided only on the discharge side of the integration capacitor 7 (or current integrator 7'). Contrary to this, in the present embodiment, a current adjustment unit 1001 including a differential pair of PNP transistors and the reference voltage generation unit 33 is disposed on the charge current source 300 side. By this means, the voltage of the output terminal 200 can be stabilized even at the top end point (t2 to t4 in FIG. 9). An amplifier 31, a variable reference voltage generation unit 32, and a selector 43 are provided to operate the current adjustment unit.

An auxiliary charge current source 330 and an auxiliary discharge current source 331 are also added. The current value of the auxiliary charge current source 300 is I2" and the current value of the auxiliary discharge current source 331 is I1".

The amplifier 31 amplifies the difference between the terminal voltage of the integration capacitor 7 and the output voltage value VBB of the variable reference voltage generation unit 32. The output of the amplifier 31 is connected to a base terminal of the transistor Q3.

In view of the difference of the voltage of the base terminal of the transistor Q3 (output voltage of the amplifier 31) and the voltage of the base terminal of the transistor Q4 (output voltage of the reference voltage generation unit 33), the discharge current Ib2 is outputted from the collector terminal of the transistor Q3 to the connection terminal of the integration capacitor 7.

Further, with the insertion of the two differential pairs (current adjustment units), the current adjustment unit 1001 on the charge current source 300 side or the current adjustment unit 1000 on the discharge current source 301 side needs to be temporarily cut. For its achievement, a selector 41 and a selector 43 are disposed.

Further, the auxiliary charge current source 330, a switch 44, the auxiliary discharge current source 331, and a switch 42 are added to the circuit of FIG. 1, and a timing control unit 40 is provided for controlling the operation of the selector 41, the switch 42, the selector 43, and the switch 44.

The selector 43 determines whether the current adjustment unit 1001 is used for the charging of the integration capacitor 7 (Out1), the integration capacitor 7 is directly connected to the charge current source 300 side (Out2), or the charge current source 300 is separated from the integration capacitor 7 (Out3). Similarly, the selector 41 selects whether the current adjustment unit 1000 is used for the discharging of the integration capacitor 7 (Out1), the integration capacitor 7 is directly connected to the discharge current source 301 side (Out2), or the integration capacitor 7 is separated from the discharge current source 301 and the like (Out3). The two selectors are controlled by the timing control unit 40.

The switch 44 determines whether or not the auxiliary charge current source 330 is used.

Similarly, the switch 42 determines whether or not the auxiliary discharge current source 331 is used.

By this means, the auxiliary discharge current source 331 can aim for the effect similar to that of the discharge current source 311 in FIG. 3 (adjustment of (dV/dt)). However, these switches are configured as shown in FIG. 8 for the purpose of providing the operating conditions.

Also in the present embodiment, the operating conditions of the differential amplifier of the first embodiment and the like need to be provided so as to operate the current adjustment unit 1000 or the current adjustment unit 1001. More specifically, the operating condition is "current on discharge current source side (I1+I1')>current on charge current source side (I2)" when using the current adjustment unit 1000. On the other hand, the operating condition is "current on discharge current source side (I1)<current on charge current source side (I2+I2")" when using the current adjustment unit 1001.

In order to provide such conditions, the auxiliary charge current source 330 and the auxiliary discharge current source 331 are prepared and used in combination with the charge current source 300 and the discharge current source 301. By this means, the operating conditions described above can be easily provided.

Figure 13:
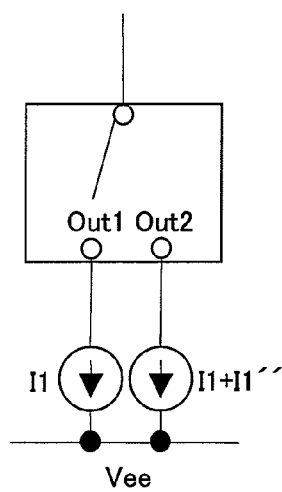
FIG. 13 is a circuit diagram showing a periphery of a switch for the description of the fourth embodiment of the present invention.

Alternatively, a method in which two current sources having different current amounts are prepared to switch them with a selector may be possible (see FIG. 13). However, if the two current sources are switched for use, the accuracy of the start voltage VB at the bottom end point and the start voltage VBB at the top end point declines even only temporarily during the switching.

When a constant current continuously flows by the current source and an auxiliary current source is connected under a specific condition like in the present embodiment, the start voltage at the top end point and the bottom end point can be more stabilized. Therefore, the configuration shown in FIG. 8 is more preferable in view of the application to the field of measurement. However, the configuration of FIG. 13 may also be one of the options if conditions permit.

The ON/OFF of the two switches is also controlled by the timing control unit 40.

A specific operation of the circuit will be described with reference to FIG. 9. Similar to the above embodiments, the description will be started from when the output voltage VB of the variable reference voltage generation unit 4 is set to VB1, the selector 41 is switched to Out1, the switch 42 is turned ON, and then the output voltage VB stabilizes at VB1. Also, the description will be started from the state in which the selector 43 directly connects the charge current source 300 and the integration capacitor 7 (Out2), and the switch 44 is turned OFF. Note that I1+I1'>I2 has to be provided so as to satisfy the operating condition of the current adjustment unit 1000 in this state.

When the ramp waveform is to be generated (t1 in FIG. 9), the timing control unit 40 switches the selector 41 to Out3 to separate the integration capacitor 7 from the discharge current source 301 and the like. Simultaneously, the selector 43 is switched to Out2 to directly connect the integration capacitor 7 to the charge current source 300. Thus, the current does not flow to I1c and I2b of the charge/discharge currents I1b, I1c, I2b, and I2c of the integration capacitor 7. Further, the current value of I2c is the current value I2 of the charge current source 300.

Accordingly, the current flowing to the integration capacitor 7 is only I2, and the output voltage Vout of the output terminal 200 rises with a slope of dV/dt=I2/C.

Next, at the timing when Vout reaches VBB to be the top end point (t2 in FIG. 9), the timing control unit 40 switches the selector 41 to Out2, the switch 42 to OFF, the selector 43 to Out1, and the switch 44 to ON. By this means, the current does not flow to I1b and I2c of the charge/discharge currents I1b, I1c, I2b, and I2c of the integration capacitor 7, and the discharge current value of I1c is I1.

At this timing, the output voltage Vout of the output terminal 200 becomes equal to the output voltage VBB1 of the variable reference voltage generation unit 32 by the current adjustment unit 1001, and the current value of I2b at the time of convergence becomes I1. Also at this timing, the maximum value of I2b needs to be larger than I1c, and each current source needs to be designed so that I2+I2">I1 can be satisfied. This intends to provide the condition of the differential amplification of the current adjustment unit 1001.

In FIG. 9, the switch 42 only needs to be turned OFF at the timing of t2 (timing when the selector 41 is switched to Out2), and the previous state thereof is no object.

Further, when the output voltage Vout of the output terminal 200 is lowered from the output voltage VBB of the variable reference voltage generation unit 32 for the generation of a ramp waveform on the voltage-decrease side (t4 in FIG. 9), the timing control unit 40 switches the selector 41 to Out2, the switch 42 to OFF, the selector 43 to Out3, and the switch 44 to OFF. By this means, the current flowing to the integration capacitor 7 becomes only I1c=I1, and the output voltage Vout lowers with a slope of dV/dt=−I1/C.

Then, when the output voltage Vout of the output terminal 200 is lowered to the value of the output voltage VB of the variable reference voltage generation unit 4, the timing control unit 40 switches the selector 41 to Out1, the switch 42 to ON, and the selector 43 to Out2. The output voltage Vout stabilizes there (t5 in FIG. 9).

In FIG. 9, the switch 44 only needs to be turned OFF before the timing of t5 (timing when the selector 43 is switched to Out2), and does not necessarily need to be turned OFF at this timing.

Also at the timing of t5, I1+I1">I2 which is the operating condition of the current adjustment unit 1000 needs to be provided.

If the output voltage VB of the variable reference voltage generation unit 4 is to be changed, it has to be changed in the period between the start of charging and the start of discharging of the integration capacitor 7 (period from t1 to t4 in FIG. 9) similar to the first embodiment. In FIG. 9, the output voltage VB of the variable reference voltage generation unit 4 is changed at the timing of t3.

Further, if the output voltage VBB of the variable reference voltage generation unit 32 is to be changed, it has to be changed in the period between the start of discharging and the start of charging of the integration capacitor 7 (period from t4 to t7 in FIG. 9). In FIG. 9, the output voltage VBB of the variable reference voltage generation unit 32 is changed at the timing of t6.

Thereafter, the above-described operation is repeated after the timing of t5, so that a ramp waveform in which a bottom end point and a top end point of the fixed voltage value are stable can be outputted.

Also in this embodiment, it is needless to say that other elements such as MOSFET can be used instead of the transistors of each current adjustment unit.

Fifth Embodiment

Figure 10:
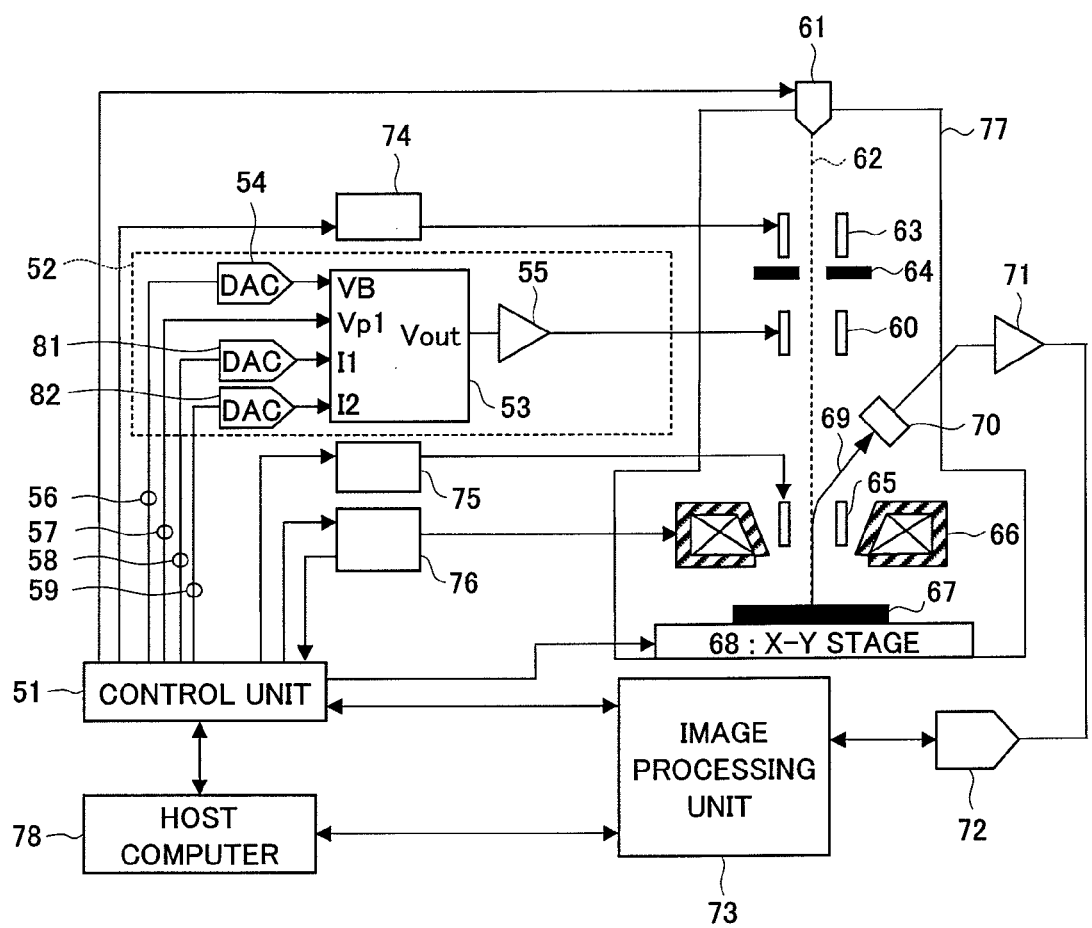
FIG. 10 is a schematic view of a circuit pattern inspection apparatus according to a fifth embodiment of the present invention.
Figure 11:
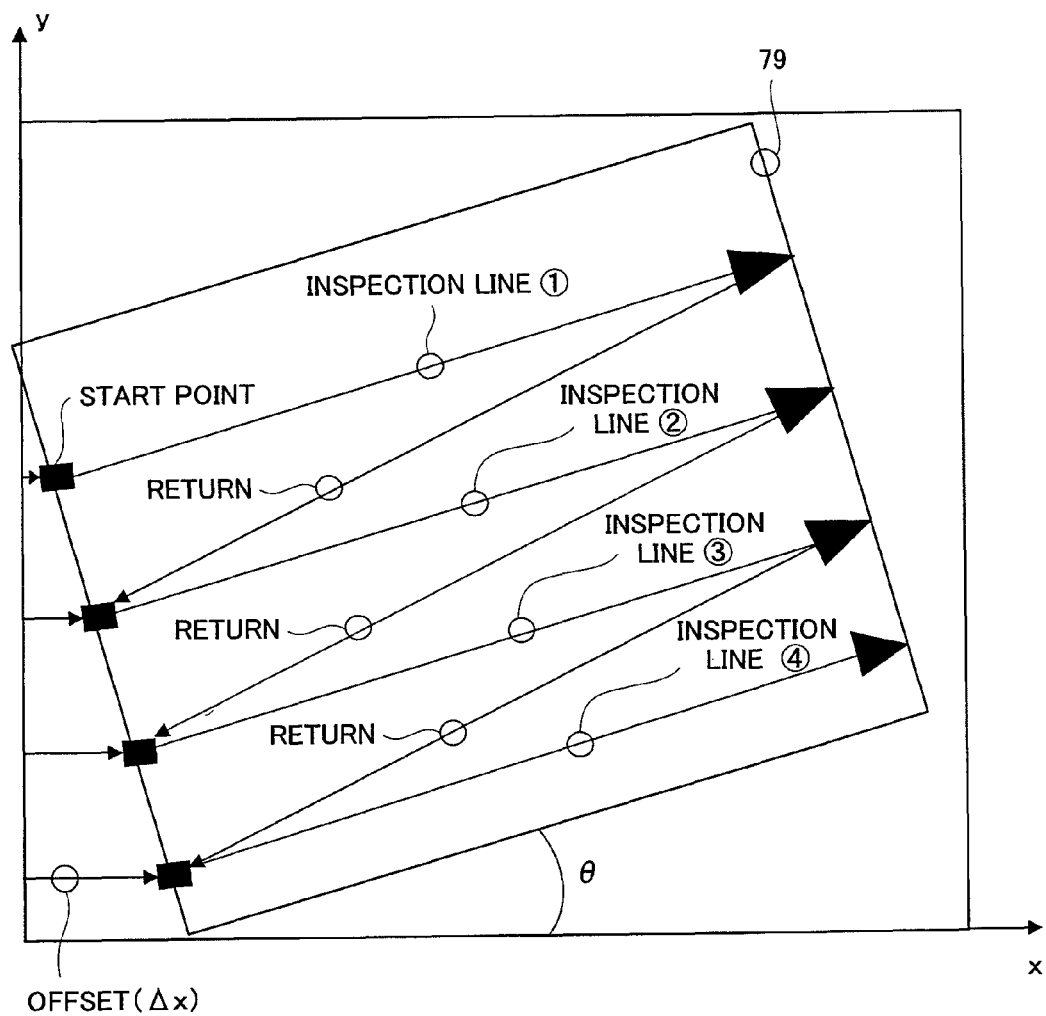
FIG. 11 is a view showing an inspection example of the circuit pattern inspection apparatus according to the fifth embodiment of the present invention.
Figure 12:
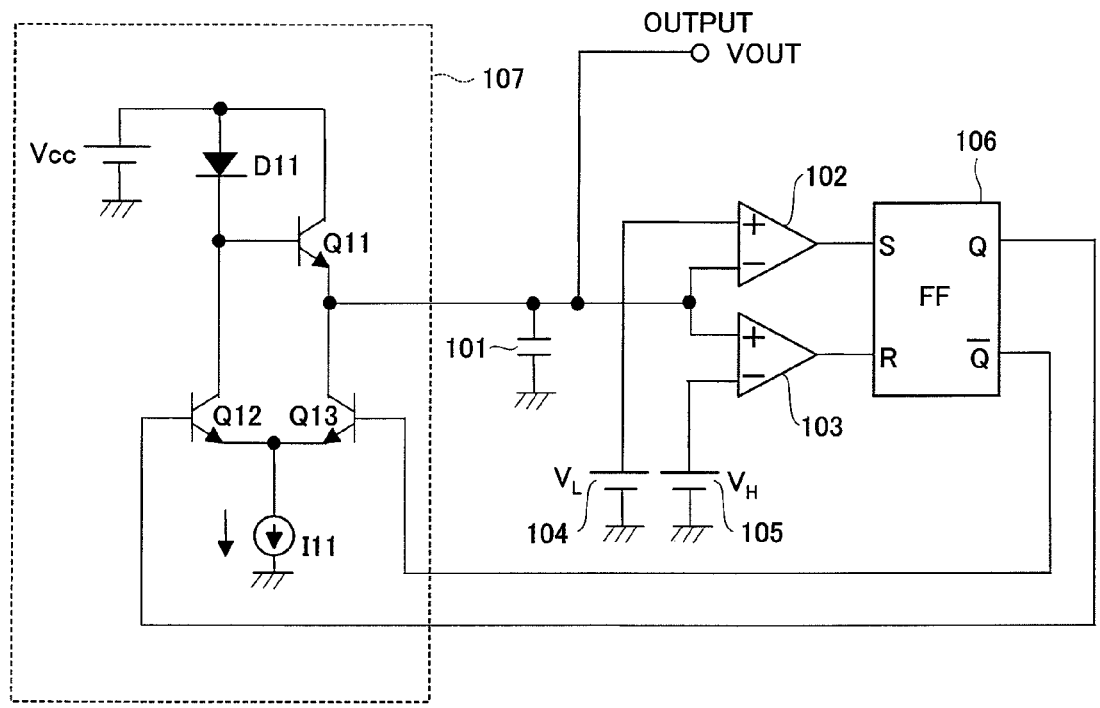
FIG. 12 is a circuit diagram showing a configuration of a conventional ramp generator.

Each of the ramp generators of each of the embodiments described above can be applied to a circuit pattern inspection apparatus. FIG. 10 is a schematic view when the ramp generator of the first embodiment is applied to the circuit pattern inspection apparatus, and FIG. 11 shows an inspection example of the inspection apparatus.

The circuit pattern inspection apparatus of the present embodiment is used to inspect the circuit pattern formed on a semiconductor substrate (wafer). A technique of scanning electron microscope is applied thereto, in which the semiconductor substrate is scanned with the electron beam, the secondary electrons generated by the irradiation of the electron beam from the semiconductor substrate are detected, and the circuit pattern is inspected using a secondary electron image.

A ramp generator unit 53 in FIG. 10 is the circuit described in the first embodiment.

In an electron optical system 77, a electron beam 62 emitted from an electron gun 61 is passed through a blanking deflector 63, a slit 64, a beam deflector 60, an ExB deflector 65, and an objective lens 66 and focused and irradiated on a substrate to be inspected 67 on an X-Y stage 68. When the electron beam 62 is irradiated, secondary electrons 69 are generated from the substrate to be inspected 67. The secondary electrons 69 are deflected by the ExB deflector 65 and detected by the detector 70.

Then, while continuously moving the substrate to be inspected 67 in a Y direction by the X-Y stage 68, the beam deflector 60 is operated so that the electron beam 62 repeatedly scans the substrate to be inspected 67 in an X direction. The secondary electrons 69 generated from the substrate to be inspected 67 are detected by the detector 70 in synchronization with the repetitive scanning, thereby obtaining the two-dimensional electron beam image of the substrate to be inspected 67. When the X-Y stage 68 is moved in the X direction, the control is carried out so that the electron beam 62 repeatedly scans the substrate to be inspected 67 in the Y direction.

The signal detected by the detector 70 is amplified by a pre-amplifier 71 and then converted to a digital signal by an A/D converter 72. An image processing unit 73 creates a two-dimensional image based on the digital signal, detects failures in the image, and sends a detection result to a host computer 78. Note that, although the detector 70 is configured to detect the secondary electrons 69 generated from the substrate to be inspected, it may be configured to detect reflected electrons, transmission electrons, or absorption electrons generated from the substrate to be inspected.

The control unit 51 receives signals from the host computer 78 and controls the electron gun 61, the image processing unit 73, the blanking deflection control circuit 74, the beam deflection control circuit 80, the ExB deflection control circuit 75, the objective lens power source 76, and the X-Y stage 68.

Similarly, the ramp generator unit 53 in the beam deflection control circuit 52 outputs a ramp waveform to the output amplifier 55 according to the control signals 56, 57, 58, and 59 from the control unit 51. The control signal 56 performs data setting of the D/A converter (DAC) 54, and the output voltage thereof becomes the VB voltage in the ramp generator unit 53.

The control signal 58 and the control signal 59 perform data setting of the D/A converter 81 and the D/A converter 82, and the outputs thereof perform setting of the current sources I1 and I2 in the ramp generator unit 53. The control signal 57 is provided as Vp1 in the ramp generator unit 53 and performs the timing control of the switch 1.

The output amplifier 55 amplifies the output signal and applies the same to the beam deflector 60. The output signal includes a waveform for generating an inspection line and a waveform for returning to the starting point of the next inspection line, and the electron beam 62 is irradiated on the inspection region 79 through the repetitive scanning of the waveforms as shown in FIG. 11. The beam scanning in an oblique direction becomes possible by providing two systems of the beam deflection control circuit for the X direction component and the Y direction component.

The inspection apparatus converts the detection signal into an image in synchronization with the inspection lines (1), (2), (3), ... and creates a two-dimensional image. However, when an inspection sample having a certain rotation angle θ is to be inspected as shown in FIG. 11, in order to set an offset (Δx) different for each inspection line to the beam deflection in the X direction, the ramp waveform needs to set different start voltages for each inspection line. In such a case, by changing the output voltage of the D/A converter 54 for each inspection line by the control signal 56, it is possible to deal with the rotation of the inspection sample.

In the foregoing, the invention made by the inventors of the present invention has been concretely described based on the embodiments. However, it is needless to say that the present invention is not limited to the foregoing embodiments and various modifications and alterations can be made within the scope of the present invention.

A current-integration ramp generator capable of controlling a start voltage is realized by configuring a ramp generator using the present invention. Accordingly, the current-integration ramp generator can be applied to various apparatuses such as the circuit pattern inspection apparatus, and the noise reduction and the accuracy improvement in the apparatus can be realized.

What is claimed is:

1. A ramp generator comprising: a capacitor for charging/discharging current; a charge current source for charging the capacitor; a discharge current source for discharging the capacitor; a first feedback circuit; a first selector; a second feedback circuit; and a second selector,
    wherein the first feedback circuit is connected to the first selector and the capacitor,
    the second feedback circuit is connected to the second selector and the capacitor,
    the first selector selects whether the discharge current source is connected to the capacitor via the first feedback circuit, the discharge current source is directly connected to the capacitor, or the discharge current source is opened,
    the second selector selects whether the charge current source is connected to the capacitor via the first feedback circuit, the charge current source is directly connected to the capacitor, or the charge current source is opened,
    charging of the capacitor starts when the first selector opens the discharge current source,
    discharging of the capacitor starts when the second selector opens the charge current source, and
    a ramp waveform is outputted from a connection point of the capacitor, the first feedback circuit, the second feedback circuit, the first selector and the second selector.

2. The ramp generator according to claim 1, further comprising: an auxiliary charge current source; an auxiliary discharge current source; a first switch; and a second switch,
    wherein the auxiliary discharge current source is connected to the first selector in parallel to the discharge current source via the first switch, and
    the auxiliary charge current source is connected to the second selector in parallel to the charge current source via the second switch.

3. The ramp generator according to claim 2,
    wherein operating conditions of the first feedback circuit and the second feedback circuit are satisfied by switching the first switch and the second switch.

4. The ramp generator according to claim 1,
wherein the first feedback circuit includes: a current adjustment circuit including a differential pair of two transistors; an amplifier; and a variable reference voltage source,
the second feedback circuit includes: a current adjustment circuit including a differential pair of two transistors; an amplifier; and a variable reference voltage source,
the variable reference voltage source of the first feedback circuit sets a stable voltage on a low voltage side, and
the variable reference voltage source of the second feedback circuit sets a stable voltage on a high voltage side.

5. A circuit pattern inspection apparatus using the ramp generator according to claim 1.

\* \* \* \* \*